United States Patent
Chen

(10) Patent No.: US 9,779,646 B2
(45) Date of Patent: Oct. 3, 2017

(54) SHIFT REGISTER, METHOD AND SYSTEM FOR OPERATING SHIFT REGISTER

(71) Applicants: Shanghai AVIC Optoelectronics Co., Ltd, Shanghai (CN); Tianma Micro-Electronics Co., Ltd., Shenzhen (CN)

(72) Inventor: Chen Chen, Shanghai (CN)

(73) Assignees: SHANGHAI AVIC OPTOELECTRONICS CO., LTD., Shanghai (CN); TIANMA MICRO-ELECTRONICS CO., LTD., Shenzhen (CN)

(*) Notice: Subject to any disclaimer, the term of this patent is extended or adjusted under 35 U.S.C. 154(b) by 99 days.

(21) Appl. No.: 14/848,981

(22) Filed: Sep. 9, 2015

(65) Prior Publication Data

US 2016/0189795 A1    Jun. 30, 2016

(30) Foreign Application Priority Data

Dec. 30, 2014   (CN) .......................... 2014 1 0857310

(51) Int. Cl.
| | |
|---|---|
| *G11C 19/00* | (2006.01) |
| *G09G 3/20* | (2006.01) |
| *G09G 3/3266* | (2016.01) |
| *G09G 3/36* | (2006.01) |
| *G11C 19/28* | (2006.01) |

(52) U.S. Cl.
CPC .............. *G09G 3/20* (2013.01); *G09G 3/3266* (2013.01); *G09G 3/3674* (2013.01); *G11C 19/287* (2013.01); *G09G 2310/0267* (2013.01); *G09G 2310/0286* (2013.01); *G11C 19/28* (2013.01)

(58) Field of Classification Search
None
See application file for complete search history.

(56) References Cited

U.S. PATENT DOCUMENTS

| | | | |
|---|---|---|---|
| 2008/0012818 A1* | 1/2008 | Lee | ...................... G09G 3/3677 345/100 |
| 2008/0187089 A1* | 8/2008 | Miyayama | ............. G11C 19/28 377/79 |

(Continued)

FOREIGN PATENT DOCUMENTS

CN        102467890 B        5/2014

*Primary Examiner* — Tuan T Lam
(74) *Attorney, Agent, or Firm* — Alston & Bird LLP

(57) ABSTRACT

A shift register, a method and a system for operating the shift register are provided. The shift register includes: an input circuit adapted to output a first voltage signal in response to an input signal; a trigger circuit adapted to generate a second voltage signal based on a first reference voltage and a second reference voltage, in response to the first voltage signal; and generate a third voltage signal, different than the second voltage signal, based on the first reference voltage and the second reference voltage, in response to the first voltage signal; and an output circuit adapted to output a scanning signal based on the second voltage signal and the third voltage signal. The voltages of the second voltage signal and the third voltage signal depend on a voltage dividing value of the trigger circuit, and the voltage dividing value of the trigger circuit is based on the first reference voltage and the second reference voltage.

15 Claims, 7 Drawing Sheets

(56) References Cited

U.S. PATENT DOCUMENTS

| | | | |
|---|---|---|---|
| 2008/0219401 A1* | 9/2008 | Tobita | G09G 3/3677 377/79 |
| 2009/0167668 A1* | 7/2009 | Kim | G09G 3/3677 345/100 |
| 2011/0222645 A1* | 9/2011 | Tobita | G09G 3/3677 377/78 |
| 2012/0105397 A1 | 5/2012 | Tan et al. | |
| 2012/0269316 A1* | 10/2012 | Jang | G09G 3/3677 377/75 |
| 2012/0293737 A1* | 11/2012 | Li | G09G 3/3677 349/42 |
| 2013/0136224 A1* | 5/2013 | Qing | G11C 19/28 377/64 |
| 2014/0079173 A1* | 3/2014 | Yan | G11C 19/28 377/64 |
| 2014/0168049 A1* | 6/2014 | Gu | G09G 3/3685 345/100 |
| 2014/0168050 A1* | 6/2014 | Gu | G09G 3/3611 345/100 |
| 2016/0172054 A1* | 6/2016 | Shao | G11C 19/184 345/100 |

\* cited by examiner

SHIFT REGISTER, METHOD AND SYSTEM FOR OPERATING SHIFT REGISTER

CROSS REFERENCE TO RELATED APPLICATIONS

The present application claims priority to Chinese Patent Application No. 201410857310.5, entitled "SHIFT REGISTER, METHOD FOR DRIVING SHIFT REGISTER, GATE DRIVING CIRCUIT AND DISPLAY SCREEN", filed on Dec. 30, 2014 with the State Intellectual Property Office of People's Republic of China, which is incorporated herein by reference in its entirety.

FIELD OF THE INVENTION

The disclosure relates to the field of a display device, and in particular to a shift register, a method and a system for operating the shift register.

BACKGROUND OF THE INVENTION

Devices for driving a Thin Film Switching device (TFT) display mainly include a gate driving circuit and a data drive circuit. The gate driving circuit outputs various types of input control signals to gate lines of a display panel via a shift register. Generally, the gate driving circuit may be formed on a TFT panel. The gate driving circuit may include multiple cascaded shift registers, each of which is connected to one gate line to output a gate drive signal.

When a gate scanning is performed by the gate driving circuit, output signals of respective shift registers may attenuate stage by stage with the increasing of the stages of the shift registers, thereby influencing a response speed of the gate driving circuit and a display effect of an image.

BRIEF SUMMARY OF THE INVENTION

In order to solve the problems above, according to the disclosure, a shift register, a method for driving a shift register, a gate driving circuit and a display screen are provided, which avoid a problem that output signals of the shift registers attenuate in case of scanning, and ensure a response speed and a display effect of an image.

In order to achieve the objects above, a shift register is provided according to the disclosure, which includes:

an input circuit adapted to output a first voltage signal in response to an input signal;

a trigger circuit adapted to generate a second voltage signal and a third voltage signal based on a first reference voltage and a second reference voltage, in response to the first voltage signal; and an output circuit adapted to output a scanning signal based on the second voltage signal and the third voltage signal.

According to disclosure, a method for driving the shift register described above is provided, which includes:

receiving an input signal;

outputting a first voltage signal in response to the input signal;

generating a second voltage signal and a third voltage signal based on a first reference voltage and a second reference voltage, in response to the first voltage signal; and outputting a scanning signal based on the second voltage signal and the third voltage signal.

According to the disclosure, a gate driving circuit is provided, which includes N cascaded shift registers, where N is a positive integer greater than 2; and where the N cascaded shift registers include the first stage of shift register to the N-th stage of shift register, and each of the shift registers is the shift register described above.

According to the above description, the shift register described in the disclosure includes: an input circuit adapted to output a first voltage signal in response to an input signal; a trigger circuit adapted to generate a second voltage signal and a third voltage signal based on a first reference voltage and a second reference voltage, in response to the first voltage signal; and an output circuit adapted to output a scanning signal based on the second voltage signal and the third voltage signal. In the shift register, the values of the second voltage signal and the third voltage signal depend on a voltage dividing value of the trigger circuit, and the voltage dividing value of the trigger circuit is based on the first reference voltage and the second reference voltage. The first voltage signal output by the input circuit is only adapted to trigger the trigger circuit. Thus, voltages of output signals of output circuits of respective stages of shift registers are the same and do not attenuate, which is based on the second voltage signal and the third voltage signal. In this way, a response speed of the scanning of the gate, and a display effect of an image are ensured.

BRIEF DESCRIPTION OF THE DRAWINGS

In order to illustrate the technical solutions in the embodiments of the invention or in the conventional technology more clearly, hereinafter the drawings for the description of the embodiments or the conventional technology are simply introduced. Apparently, the drawings described below are only the embodiments of the invention, and other drawings may be obtained based on the provided drawings by those skilled in the art without any creative work.

DETAILED DESCRIPTION OF THE INVENTION

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The technical solutions in the embodiments of the invention will be described clearly and completely in conjunction with the drawings of the embodiments of the invention hereinafter. Apparently, the described embodiments are only some of the embodiments of the invention, but not all the embodiments. All of other embodiments obtained based on the embodiments of the invention by those skilled in the art without any creative work fall within the scope of protection of the disclosure.

According to an embodiment of the invention, a shift register is provided, which includes: an input circuit adapted to output a first voltage signal in response to an input signal; a trigger circuit adapted to generate a second voltage signal and a third voltage signal based on a first reference voltage and a second reference voltage, in response to the first voltage signal; and an output circuit adapted to output a scanning signal based on the second voltage signal and the third voltage signal.

In order to illustrate the technical solutions provided by the embodiments of the invention more clearly, hereinafter the technical solutions above will be described in detail in conjunction with the drawings.

Figure 1:
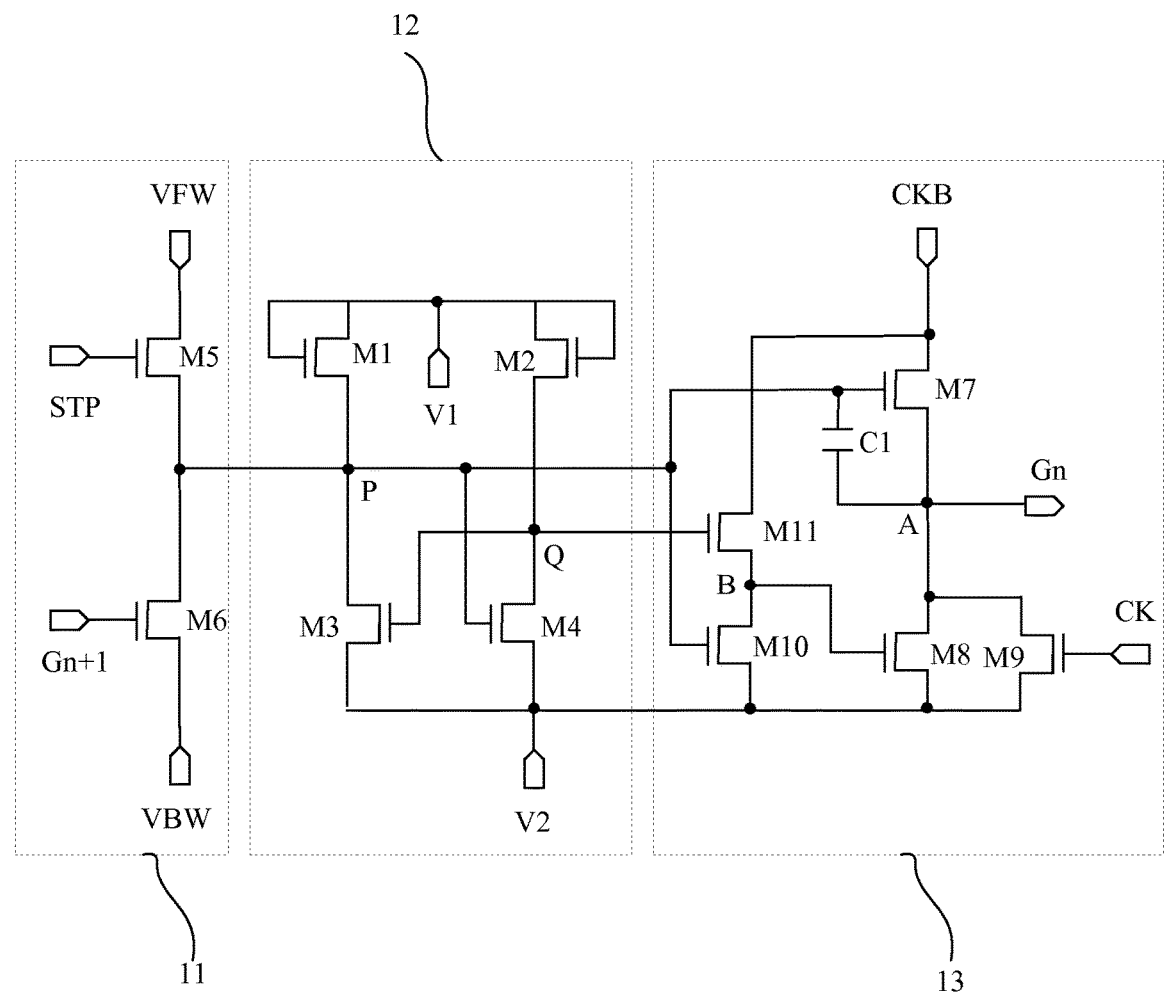
FIG. 1 is a schematic structural diagram of a shift register according to an embodiment of the invention.

Referring to FIG. 1, a schematic structural diagram of a shift register according to an embodiment of the invention is shown. The shift register includes an input circuit 11, a trigger circuit 12 and an output circuit 13. The input circuit 11 is adapted to output a first voltage signal in response to an input signal. The trigger circuit 12 is adapted to generate a second voltage signal and a third voltage signal based on a first reference voltage and a second reference voltage, in response to the first voltage signal. The output circuit 13 is adapted to output a scanning signal based on the second voltage signal and the third voltage signal.

The trigger circuit 12 includes a first switching device M1, a second switching device M2, a third switching device M3 and a fourth switching device M4. The first reference voltage V1 is input to a gate and a first electrode of the first switching device M1, and a second electrode of the first switching device M1 is electrically connected to a first node P. The first reference voltage V1 is input to a gate and a first electrode of the second switching device M2, and a second electrode of the second switching device M2 is electrically connected to a second node Q. A gate of the third switching device M3 is electrically connected to the second node Q, a first electrode of the third switching device M3 is electrically connected to the first node P, and the second reference voltage V2 is input to a second electrode of the third switching device M3. A gate of the fourth switching device M4 is electrically connected to the first node P, a first electrode of the fourth switching device M4 is electrically connected to the second node Q, and the second reference voltage V2 is input to a second electrode of the fourth switching device M4.

The first voltage signal is input to the first node P, and then the first node P outputs a third voltage signal. The first voltage signal is adapted to control a level of the first node P to jump. The second node Q outputs a second voltage signal. A channel of the first switching device M1 is wider than a channel of the second switching device M2.

One of the first reference voltage V1 and the second reference voltage V2 is a high level, and the other one is a low level. In an embodiment of the invention, the high level is a voltage greater than a threshold for switching on an N-channel Metal Oxide Semiconductor (NMOS) transistor, which may control the NMOS to switch on. The low level is a voltage less than a threshold for switching on a P-channel Metal Oxide Semiconductor (PMOS) transistor, which may control the PMOS to switch on. Apparently, the high level is higher than the low level.

In the trigger circuit 12 of the shift register shown in FIG. 1, the first switching device M1, the second switching device M2, the third switching device M3 and the fourth switching device M4 are NMOS transistors. The first reference voltage V1 is higher than the second reference voltage V2, i.e., the first reference voltage V1 is the high level, and the second reference voltage V2 is the low level. Alternatively, the first switching device M1, the second switching device M2, the third switching device M3 and the fourth switching device M4 are PMOS transistors. The first reference voltage V1 is lower than the second reference voltage V2, i.e., the first reference voltage V1 is the low level, and the second reference voltage V2 is the high level.

In this case, the trigger circuit 12 forms a self-stabilizing circuit. In the case that no signal is input to the first node P (the first voltage signal is the low level), an output voltage of the first node P and an output voltage of the second node Q depend on voltage dividing values of the first switching device M1 and the second switching device M2. Since the channel of the first switching device M1 is wider than that of the second switching device M2, a resistance of the first switching device M1 is lower than that of the second switching device M2, a voltage dividing value at the first node P is lower than the voltage dividing value at the second node Q. Thus, a voltage of the first node P is stabilized at the low level, and a voltage of the second node Q is stabilized at the high level. That is, in the case that no signal is input to the first node P, the third voltage signal output at the first node P is the low level, and the second voltage signal output at the second node Q is the high level. The sizes of the third voltage signal and the second voltage signal depend on a voltage dividing value of the stabilizing circuit formed by the trigger circuit 12, which will not attenuate during a signal transmission process.

In the case that a high level signal is input to the first node P (the first voltage signal is the high level), the high level is applied to the first node P. It is assumed that the first switching device M1, the second switching device M2, the third switching device M3 and the fourth switching device are all NMOS transistors, and the first reference voltage V1 is higher than the second reference voltage V2. Initially (when no signal is input to the first node P), the fourth switching device M4 is off and the third switching device M3 is on. After the first voltage signal with a high level is input, the fourth switching device M4 is switched on and the third switching device M3 is switched off. Thus, the voltage of the second node Q is pulled down to a low level by the second reference voltage V2, so as to reverse the level of the first node P and the level of the second node Q. In this case, the high level is output at the first node P, and the low level is output at the second node Q. That is, the third voltage signal output at the first node P is the high level, and the second voltage signal output at the second node Q is the low level. The first voltage signal input at the first node P is only adapted to trigger the reversion of the level of the first node P and the level of the second node Q. The output voltage of the first node P and the output voltage of the second node Q depend on the voltage dividing value of the self-stabilizing circuit formed by the trigger circuit 12, which will not attenuate during a signal transmission process.

In the case that a high level signal is input to the first node P, the voltage at the first node P is the high level. It is assumed that the first switching device M1, the second switching device M2, the third switching device M3 and the fourth switching device M4 are all PMOS transistors, and the first reference voltage V1 is lower than the second reference voltage V2. Initially, the third switching device M3 is off, and the fourth switching device M4 is on. After the first voltage signal with a high level is input, the fourth switching device M4 is switch off and the third switching device M3 is switched on, the voltage of the second node Q is pulled down to the low level by the first reference voltage V1, so as to reverse the level of the first node P and the level of the second node Q. The high level is output at the first node P, and the low level is output at the second node Q. That is, the third voltage signal output at the first node P is the high level, and the second voltage signal output at the second node Q is the low level. The first voltage signal input to the first node P is only adapted to trigger the reversion of the level of the first node P and the level of the second node Q. The output voltage of the first node P and the output voltage of the second node Q depend on a voltage dividing value of the self-stabilizing circuit formed by the trigger circuit 12, which will not attenuate during the signal transmission process.

The input circuit 11 includes a fifth switching device M5 and a sixth switching device M6. A first input signal STP is input to a gate of the fifth switching device M5, a third reference voltage VFW is input to a first electrode of the fifth switching device M5, and a second electrode of the fifth switching device M5 is electrically connected to the first node P. A second input signal Gn+1 is input to a gate of the sixth switching device M6, a first electrode of the sixth switching device M6 is electrically connected to the first node P, and a fourth reference voltage VBW is input to a second electrode of the sixth switching device M6. The first voltage signal is output at the second electrode of the fifth switching device M5 and the first electrode of the sixth switching device M6.

The output circuit includes a pull-up circuit and a pull-down circuit. The pull-up circuit is adapted to control a scanning signal to be at a first level, and the pull-down circuit is adapted to control the scanning signal to be at a second level. The first level is higher than the second level, i.e., the first level is the high level, and the second level is the low level.

Specifically, the pull-up circuit includes a seventh switching device M7 and a capacitor C1; and the pull-down circuit includes an eighth switching device M8, a ninth switching device M9, a tenth switching device M10 and an eleventh switching device M11.

A gate of the seventh switching device M7 is electrically connected to the first node P, a first clock signal CKB is input to a first electrode of the seventh switching device M7, and a second electrode of the seventh switching device M7 is electrically connected to a third node A. A gate of the eighth switching device M8 is electrically connected to a fourth node B, a first electrode of the eighth switching device M8 is electrically connected to the third node A, and the second reference voltage V2 is input to a second electrode of the eighth switching device M8. A second clock signal CK is input to a gate of the ninth switching device M9, a first electrode of the ninth switching device M9 is electrically connected to the third node A, and the second reference voltage V2 is input to a second electrode of the ninth switching device M9. A gate of the tenth switching device M10 is electrically connected to the first node P, a first electrode of the tenth switching device M10 is electrically connected to the fourth node B, and the second reference voltage V2 is input to a second electrode of the tenth switching device M10. A gate of the eleventh switching device is electrically connected to the second node Q, the first clock signal CKB is input to a first electrode of the eleventh switching device, and a second electrode of the eleventh switching device is electrically connected to the fourth node B. A first plate of the capacitor C1 is electrically connected to the gate of the seventh switching device M7, and a second plate of the capacitor C1 is electrically connected to the second electrode of the seventh switching device M7. The third node A is adapted to output the scanning signal Gn.

In the embodiment, the fifth switching device M5, the sixth switching device M6, the seventh switching device M7, the eighth switching device M8, the ninth switching device M9, the tenth switching device M10 and the eleventh switching device M11 are all NMOS transistors, which are switched on when the low level is input to the corresponding gate.

In the embodiment shown in FIG. 1, preferably the first switching device M1 to the eleventh switching device M11 are all NMOS transistors. In this case, once multiple shift registers shown in FIG. 1 are cascaded to form a gate driving circuit to perform a forward scan, the first reference voltage V1 is the high level, the second reference voltage V2 is the low level, the third reference voltage VFW is the high level, and the fourth reference voltage VBW is the low level.

Figure 2:
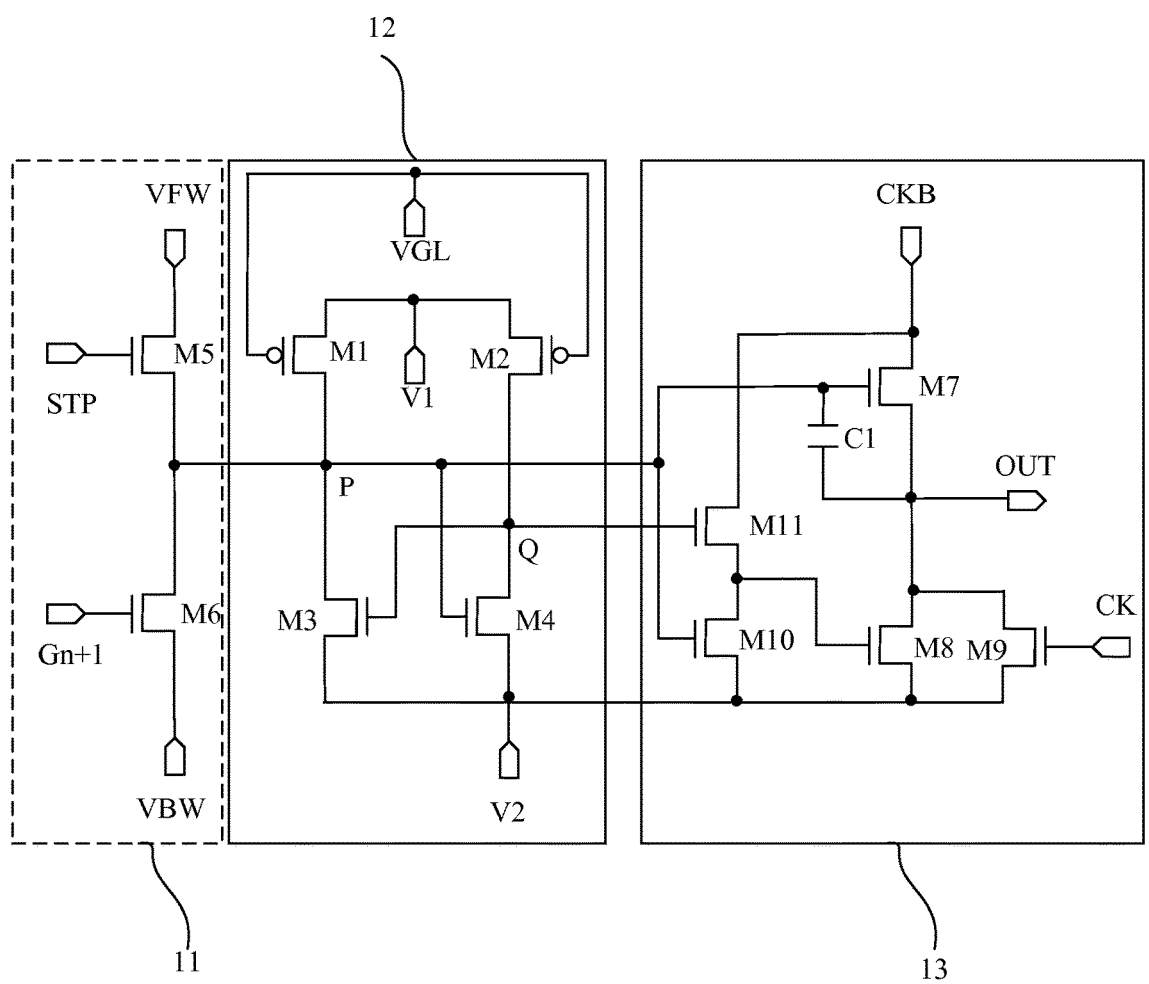
FIG. 2 is a schematic structural diagram of another shift register according to an embodiment of the invention.

Referring to FIG. 2, a schematic structural diagram of another shift register is shown according to an embodiment of the invention. A trigger circuit 12 shown in FIG. 2 also includes a first switching device M1, a second switching device M2, a third switching device M3 and a fourth switching device M4. A channel of the first switching device M1 is wider than a channel of the second switching device M2. The circuit connection of the embodiment shown in FIG. 2 differs from that of the embodiment shown in FIG. 1 in that: in FIG. 2, a gate of the first switching device M1 and a gate of the second switching device M2 are both connected to a fifth reference voltage VGL, which has the low level. In FIG. 2, the input circuit 11 and the output circuit 13 are the same as that of the embodiment shown in FIG. 1, and the connection relations among the input circuit 11, the trigger circuit and the output circuit 13 are the same as those in FIG. 1, which will be omitted herein.

In the embodiment shown in FIG. 2, the first switching device M1 and the second switching device M2 are all PMOS transistors, and the third switching device M3 and the fourth switching device M4 are NMOS transistors. The first reference voltage is higher than the second reference voltage. Similarly, the trigger circuit 12 shown in FIG. 2 may form a self-stabilizing circuit. In the case that no signal is input to the first node P, the first node P outputs the low level, and the second node Q outputs the high level. When a high level signal is input to the first node P, the level of the first node P and the level of the second node Q are reversed. The first voltage signal input to the first node P is only adapted to trigger a reversion of the level of the first node P and the level of the second node Q. An output voltage of the first node P and an output voltage of the second node Q depend on a voltage dividing value of the self-stabilizing circuit.

Figure 3:
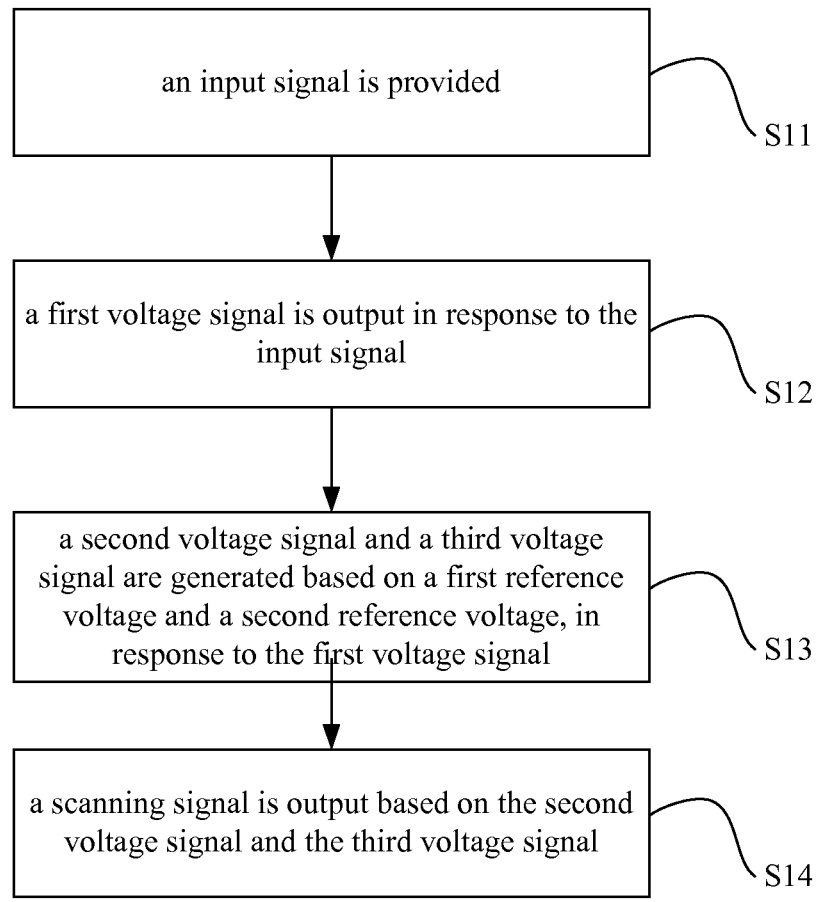
FIG. 3 is a schematic flowchart of a method for driving a shift register according to an embodiment of the invention.

According to an embodiment of the invention, a method for driving a shift register is provided. Referring to FIG. 3, a schematic flowchart of a method for driving a shift register is shown according to an embodiment of the invention. The method includes step S11 to step S14.

In step S11, an input signal is provided.

In step S12, a first voltage signal is output in response to the input signal.

In step S13, a second voltage signal and a third voltage signal are generated based on a first reference voltage and a second reference voltage, in response to the first voltage signal.

In step S14, a scanning signal is output based on the second voltage signal and the third voltage signal.

Referring to the above embodiment of the shift register, the shift register includes a first node for outputting a first voltage signal and a second node for outputting a second voltage signal. Before providing the input signal, the method for driving a shift register further includes: discharging the first node and the second node. Before the shift register is driven, the voltages of the first node and the second node may be reset via a resetting circuit, so as to discharge the first node and the second node, thereby improving a response speed of the input circuit and the trigger circuit.

The method is adapted to drive the shift register in the above embodiments. The first voltage signal is only adapted to trigger a generation of the second voltage signal and the third voltage signal. The voltages of the second voltage signal and the third voltage signal depend on a voltage dividing value, and the voltage dividing value is based on the first reference voltage and the second reference voltage. Thus, the output scanning signal is stable and does not attenuate stage by stage.

A gate driving circuit is further provided according to an embodiment of the invention. The gate driving circuit includes N cascaded shift registers, where N is a positive integer greater than 2. The N cascaded shift registers include the first stage of shift register to the N-th stage of shift register. Each of the N cascaded shift registers is the shift register described above.

In the case that the gate driving circuit performs a forward scan, the third reference voltage is higher than the fourth reference voltage. For the n-th stage of shift register, the first input signal is a scanning signal of the (n−1)th stage of shift register, and the second input signal is a scanning signal of the (n+1)th stage of shift register, where n is a positive integer larger than 1 and not larger than N.

In the case that the gate driving circuit performs a reverse scan, the third reference voltage is lower than the fourth reference voltage. For the n-th stage of shift register, the first input signal is a scanning signal of the (n+1)th stage of shift register, and the second input signal is a scanning signal of the (n−1)th stage of shift register, where n is a positive integer larger than 1 and smaller than N.

In order to illustrate the gate driving circuit provided by the embodiment of the invention more clearly, hereinafter the technical solutions will be described in detail in conjunction with the drawings.

Figure 4:
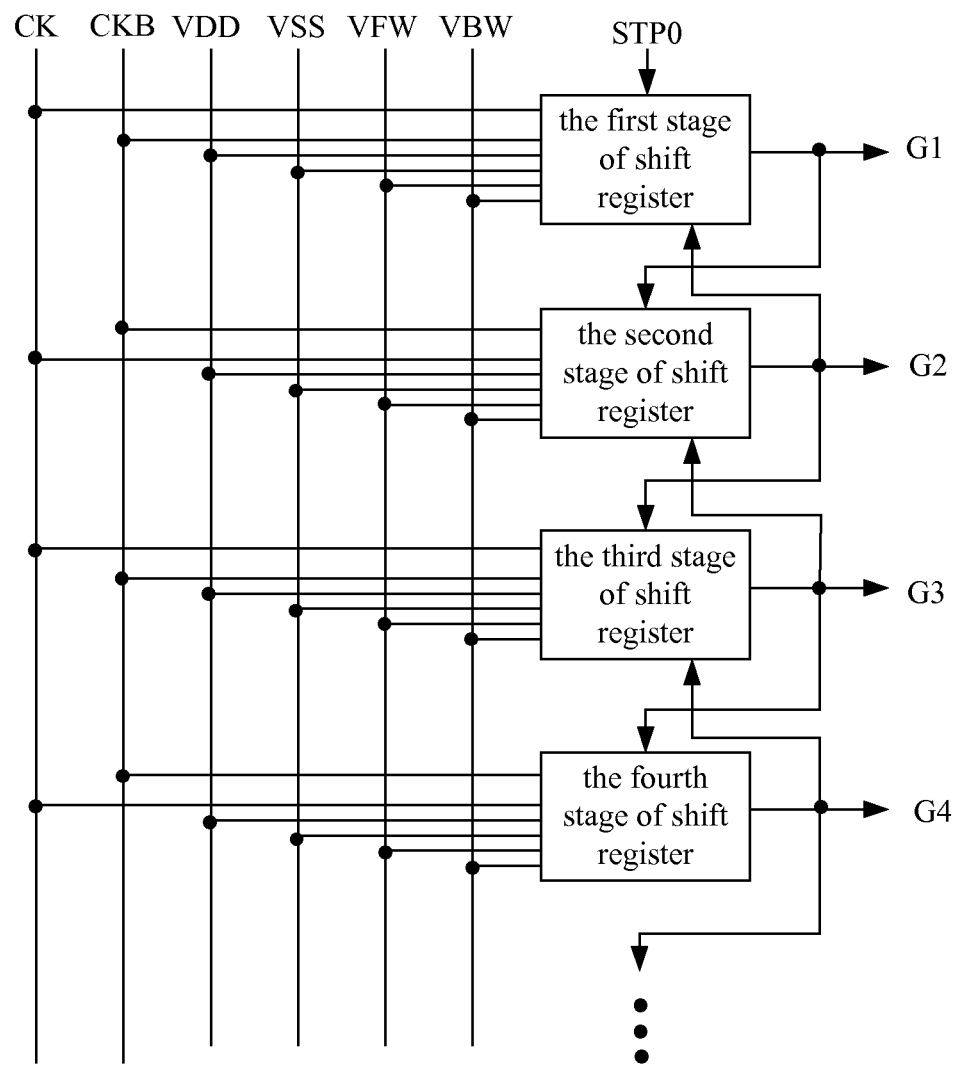
FIG. 4 is a schematic structural diagram of a gate driving circuit according to an embodiment of the invention.

Referring to FIG. 4, a schematic structural diagram of a gate driving circuit is shown according to an embodiment of the invention. The former four stages of shift registers of the gate driving circuit are shown in FIG. 4. In the case of a forward scan, a scan starting signal STP0 is input to a first input terminal of a first stage of shift register. For the n-th stage of shift register, a first input signal is a scanning signal of the (n−1)th stage of shift register, and a second input signal is a scanning signal of the (n+1)th stage of shift register, where n is a positive integer larger than 1 and not larger than N. In the case of n=3, a first input terminal of the third stage of shift register is electrically connected to an output terminal of a second stage of shift register, to receive a scanning signal G2 output from the second stage of shift register. A second input terminal of the third stage shift register is electrically connected to an output terminal of a fourth stage shift register, to receive a scanning signal G4 output from the fourth stage shift register.

The gate driving circuit described in the embodiment of the invention includes the shift register described above, output signals of respective stages of the shift registers are the same, thereby avoiding an attenuation of the output signal in case of multiple cascaded stages, and achieving a forward scan or a reverse scan.

Figure 5A:
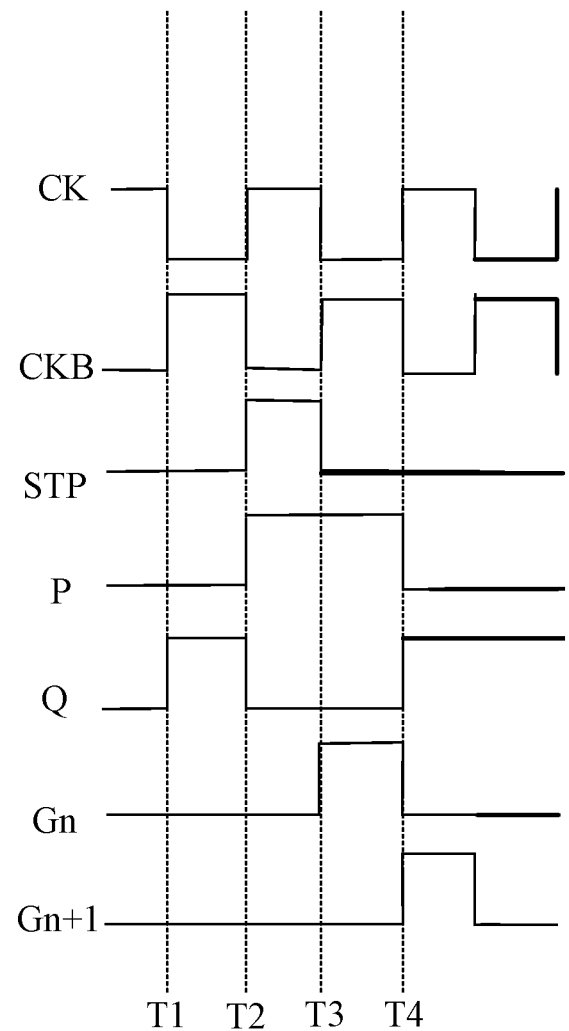
FIG. 5a is a sequence diagram according to an embodiment of the invention.

Referring to FIG. 5a, a sequence diagram is shown according to an embodiment of the invention. Hereinafter, a voltage shifting principle for scanning gates by the shift register according to the embodiment of the invention is illustrated in conjunction with the sequence diagram.

Taking the shift register shown in FIG. 1 as an example, a gate driving circuit corresponding to the shift register performs a forward scan, all of the switching devices are NMOS transistors, both the first reference voltage V1 and the third reference voltage VFW are the high level, and both the second reference voltage V2 and the fourth reference voltage VBW are the low level.

Before a stage T1, the first node P and the second node Q each have the low level without considering the interference from remaining charges in the former frame scanning At the stage T1, a first input signal STP and a second input signal Gn+1 have the low level, and thus the fifth switching device M5 and the sixth switching device M6 are off, and the input circuit 11 inputs no signal to the first node P. Due to a voltage dividing value of the self-stabilizing circuit, the first node P has the low level, and the second node Q has the high level.

The first node P has the low level, and thus the seventh switching device M7 and the tenth switching device M10 are switched off.

The second node Q has the high level, and thus the eleventh switching device M11 is switched on. A first clock signal CKB with a high level is input to the fourth node B to switch on the eighth switching device M8, and the scanning signal Gn has the second reference voltage V2 with a low level.

At a stage T2, the first input signal STP with the high level and the second input signal Gn+1 with the low level are input; the fifth switching device M5 is switched on, the sixth switching device M6 is switched off, and the input circuit 11 inputs a third reference voltage VFW with the high level to the first node P, i.e., the first voltage signal has the high level. In this case, the first voltage signal triggers a reversion of a level of the first node P and a level of the second node Q in the trigger circuit 12. Thus, the first node P has the high level and the second node Q has the low level.

The first node P has the high level to switch on the seventh switching device M7 and the tenth switching device M10, while the capacitor C1 is charged with the high level. The tenth switching device M10 is switched on, and thus the fourth node B has the second reference voltage V2 with the low level.

The second node Q has the low level to switch off the eleventh switching device M11. Since the tenth switching device M10 is switched on, the fourth node B has the second reference voltage V2 with the low level, and the eighth switching device M8 is switched off. In this case, the second clock signal CK has the high level to control the ninth switching device M9 to switch on, and thus the scanning signal Gn is the second reference voltage signal V2 with the low level. When the scanning signal with the low level is output, the eighth switching device M8 and the ninth switching device M9 are alternately switched on, thereby extending the service life of the eighth switching device M8 and the ninth switching device M9.

At a stage T3, the first input signal STP and the second input signal Gn+1 have the low level, and the input circuit 11 inputs no signal to the first node P. However, since the capacitor C1 maintains a high level at the stage T2, the capacitor C1 with the high level discharges at this time. That is, a high level signal is output from the first node P, the high level is maintained at the first node P, and the second node Q has the low level. The seventh switching device M7 and the tenth switching device M10 are switched on, and the eleventh switching device M11 is switched off.

The seventh switching device M7 is switched on, and thus the scanning signal Gn is the first clock signal CKB with the high level. The tenth switching device M10 is switched on, and thus the fourth node B is the second reference voltage V2 with the low level; and the eighth switching device is switched off, to block the second reference voltage V2 with the low level to be input to the output terminal, thereby ensuring that the scanning signal Gn with the high level is output from the output terminal. Similarly, the second clock signal CK is the low level, and the ninth switching device M9 is switched off, so as to block the second reference voltage V2 with the low level to be input to the output terminal, thereby ensuring that the scanning signal Gn with the high level is output from the output terminal.

At a stage T4, the capacitor C1 with the high level finishes discharging, the first input signal STP has the low level, and the fifth switching device M5 is switched off. The second input signal Gn+1 has the high level, the sixth switching device M6 is switched on, and the fourth reference voltage VBW with the low level is output via the sixth switching device M6, and thus the input circuit 11 outputs the low level to the first node P. In this case, a voltage of the first node P and a voltage of the second node Q depend on a voltage dividing value of the trigger circuit 12, in the case that no signal is input to the first node P. The first node P has the low level, and the second node Q has the high level.

The first node P has the low level to switch off the seventh switching device M7 and the tenth switching device M10.

The second node Q has the high level to switch on the eleventh switching device M11. The first clock signal CKB with the high level is input to the fourth node B to switch on the eighth switching device M8. The second clock signal CK has the low level to switch off the ninth switching device M9. The scanning signal Gn is the second reference voltage V2 with the low level. In this case, the second reference voltage V2 is transmitted to the output terminal via the eighth switching device M8.

The sequence diagram shown in FIG. 5a is a waveform in the case that the gate driving circuit corresponding to the shift register shown in FIG. 1 performs a forward scan. In this case, the first input signal STP is a scanning signal Gn−1 of the (n−1)th stage of shift register. The scanning signal Gn shifts by the width of one pulse in relative to the former stage scanning signal Gn−1. In a scanning process, the scanning signal Gn−1 scans the (n−1)th gate line, and then generate the scanning signal Gn to scan the n-th gate line.

Figure 5B:
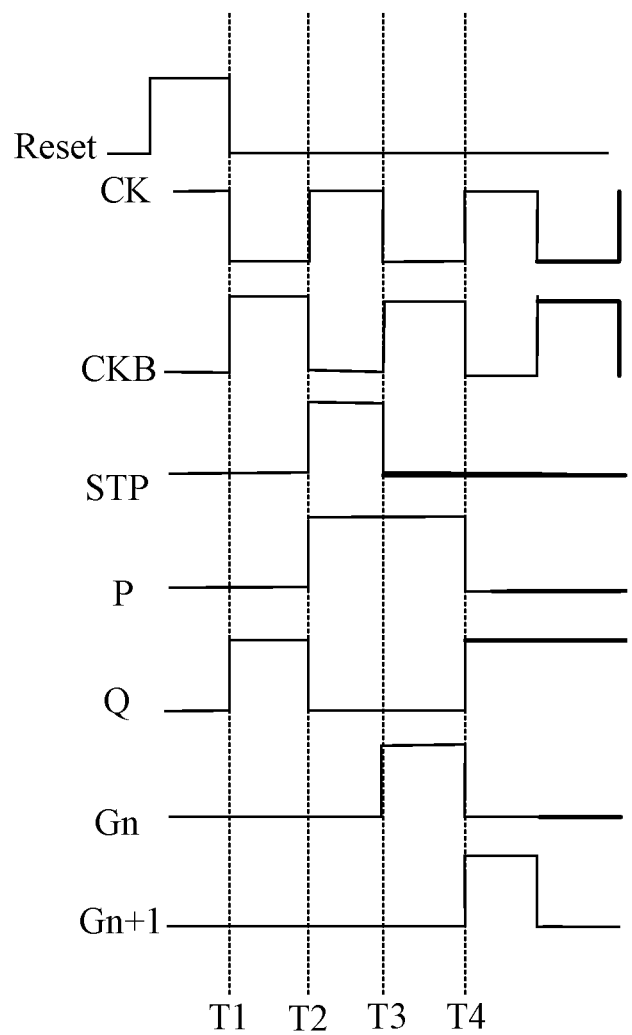
FIG. 5b is another sequence diagram according to an embodiment of the invention.
Figure 6:
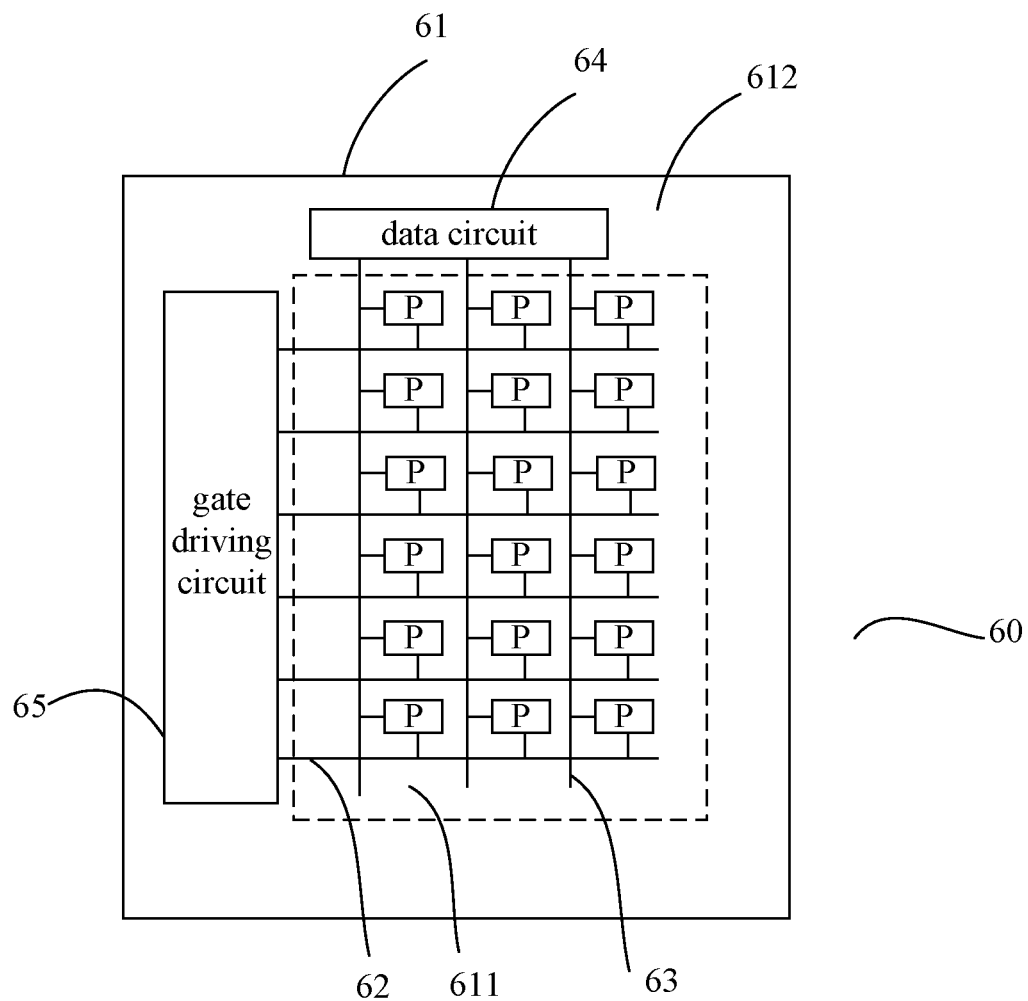
FIG. 6 is a schematic structural diagram of a display screen according to an embodiment of the invention.

Referring to FIG. 5b, another sequence diagram is shown according to an embodiment of the invention. In order to avoid a case that remaining charges of the first node P and the second node Q in the former frame scanning interfere the current frame scanning, at the stage T1, a resetting signal Reset is provided via the resetting circuit to discharge the first node P and the second node Q, and thus the first node P and the second node Q have the low level. FIG. 6 differs from FIG. 5 in that: the resetting signal Reset is added. The operation process of T1 to T4 is the same as that in FIG. 5, which will be omitted herein.

For any n-th stage of shift register, only one high level is output in one frame scanning. Thus, after the stage T4 and before an end of the frame scanning, the voltage of the first node P keeps the low level, and the voltage of the second node Q keeps the high level.

According to the above description, the voltage of the first node P and the voltage of the second node Q in the trigger circuit 12 depend on the voltage dividing value of the trigger circuit 12 itself. The input of the first node P is only adapted to trigger the reversion of the level of the first node P and the level of the second node Q, the output level of the first node P and the output level of the second node Q do not attenuate, and the scanning signal from the output circuit may switch quickly between the high level and the low level, thereby avoiding the attenuation of the scanning signal stage by stage, ensuring a fast response speed of the gate driving circuit and a display effect of an image.

A display screen is further provided according to an embodiment of the invention. Referring to FIG. 6, a schematic structural diagram of a display screen 60 is shown according to an embodiment of the invention. The display screen 60 includes: a substrate 61 including a display region 611 and a border region 612 surrounding the display region; multiple pixel units P disposed at the display region 611 and arranged in an array; multiple gate lines 62 parallel with a row of pixel units; multiple data lines 63 parallel with a column of pixel units; a data circuit 64 connected to the data line 63 and adapted to provide a data signal for pixel units P in one column of pixel units via the data line 63; and a gate driving circuit 65 electrically connected to the gate line 62 and adapted to provide a scanning signal for pixel units P in one raw of pixel units via the gate line 62. The gate driving circuit 65 is the gate driving circuit described in the above embodiments.

The display screen of the embodiment of the invention includes the gate driving circuit above. In the process of the gate scanning, the output signals of respective shift registers are the same, thereby avoiding attenuation of output signals of respective stages of shift registers, and ensuring a response speed of the gate scanning and a good display effect of an image. Those skilled in the art can implement or use the disclosure based on the above illustration of the disclosed embodiments. Many changes to these embodiments are apparent for those skilled in the art, and general principles defined herein may be implemented in other embodiments without departing from the spirit or scope of the disclosure. Hence, the disclosure is not defined by the embodiments disclosed herein, but is to conform to the widest scope in consistent with the principles and novel features disclosed herein.

What is claimed is:

1. A shift register, comprising:
an input circuit configured to output a first voltage signal in response to an input signal;
a trigger circuit configured to:
generate a second voltage signal based on a first reference voltage and a second reference voltage, in response to the first voltage signal; and
generate a third voltage signal, different than the second voltage signal, based on the first reference voltage and the second reference voltage, in response to the first voltage signal; and
an output circuit configured to output a scanning signal based on the second voltage signal and the third voltage signal;
wherein the trigger circuit comprises a first switching device, a second switching device, a third switching device and a fourth switching device;
wherein the first reference voltage is an input to a gate and a first electrode of the first switching device, and wherein a second electrode of the first switching device is electrically connected to a first node;

wherein the first reference voltage is an input to a gate and a first electrode of the second switching device, and wherein a second electrode of the second switching device is electrically connected to a second node;

wherein a gate of the third switching device is electrically connected to the second node, wherein a first electrode of the third switching device is electrically connected to the first node, and wherein the second reference voltage is an input to a second electrode of the third switching device;

wherein a gate of the fourth switching device is electrically connected to the first node, wherein a first electrode of the fourth switching device is electrically connected to the second node, and wherein the second reference voltage is an input to a second electrode of the fourth switching device; and wherein the first voltage signal is an input to the first node and the third voltage signal is an output from the first node, and wherein the first voltage signal controls a voltage level of the first node to jump;

wherein the second voltage signal is an output from the second node; and wherein a channel of the first switching device is wider than a channel of the second switching device.

2. The shift register according to claim 1, wherein the first switching device, the second switching device, the third switching device and the fourth switching device are N-channel Metal Oxide Semiconductor (NMOS) transistors respectively; and the first reference voltage is higher than the second reference voltage.

3. The shift register according to claim 1, wherein the first switching device, the second switching device, the third switching device and the fourth switching device are P-channel Metal Oxide Semiconductor (PMOS) transistors respectively; and the first reference voltage is lower than the second reference voltage.

4. The shift register according to claim 1, wherein the input circuit comprises a fifth switching device and a sixth switching device;

wherein a first input signal is an input to a gate of the fifth switching device, wherein a third reference voltage is an input to a first electrode of the fifth switching device, and wherein a second electrode of the fifth switching device is electrically connected to the first node; and wherein a second input signal is an input to a gate of the sixth switching device, wherein a first electrode of the sixth switching device is electrically connected to the first node, and wherein a fourth reference voltage is an input to a second electrode of the sixth switching device; and wherein the second electrode of the fifth switching device and the first electrode of the sixth switching device output the first voltage signal.

5. The shift register according to claim 4, wherein the output circuit comprises a pull-up circuit and a pull-down circuit;

wherein the pull-up circuit is configured to control the scanning signal to be at a first voltage level, and the pull-down circuit is configured to control the scanning signal to be at a second voltage level; and wherein the first voltage level is higher than the second voltage level.

6. The shift register according to claim 5, wherein the pull-up circuit comprises a seventh switching device and a capacitor, and wherein the pull-down circuit comprises an eight switching device, a ninth switching device, a tenth switching device and an eleventh switching device;

wherein a gate of the seventh switching device is electrically connected to the first node, wherein a first clock signal is an input to a first electrode of the seventh switching device, and wherein a second electrode of the seventh switching device is electrically connected to a third node;

wherein a gate of the eighth switching device is electrically connected to a fourth node, wherein a first electrode of the eighth switching device is electrically connected to the third node, and wherein the second reference voltage is an input to a second electrode of the eighth switching device;

wherein a second clock signal is an input to a gate of the ninth switching device, wherein a first electrode of the ninth switching device is electrically connected to the third node, and wherein the second reference voltage is an input to a second electrode of the ninth switching device;

wherein a gate of the tenth switching device is electrically connected to the first node, wherein a first electrode of the tenth switching device is electrically connected to the fourth node, and wherein the second reference voltage is an input to a second electrode of the tenth switching device;

wherein a gate of the eleventh switching device is electrically connected to the second node, wherein the first clock signal is an input to a first electrode of the eleventh switching device, and wherein a second electrode of the eleventh switching device is electrically connected to the fourth node;

wherein a first plate of the capacitor is electrically connected to the gate of the seventh switching device, and wherein a second plate of the capacitor is electrically connected to the second electrode of the seventh switching device; and wherein the scanning signal is an output at the third node.

7. The shift register according to claim 6, wherein the fifth switching device, the sixth switching device, the seventh switching device, the eighth switching device, the ninth switching device, the tenth switching device and the eleventh switching device are all NMOS transistors.

8. A shift register, comprising:
an input circuit configured to output a first voltage signal in response to an input signal;
a trigger circuit configured to:
generate a second voltage signal based on a first reference voltage and a second reference voltage, in response to the first voltage signal; and
generate a third voltage signal, different than the second voltage signal, based on the first reference voltage and the second reference voltage, in response to the first voltage signal; and
an output circuit configured to output a scanning signal based on the second voltage signal and the third voltage signal;
wherein the trigger circuit comprises a first switching device, a second switching device, a third switching device and a fourth switching device;
wherein a fifth reference voltage is an input to a gate of the first switching device, wherein the first reference voltage is an input to a first electrode of the first switching device, and wherein a second electrode of the first switching device is electrically connected to a first node;
wherein the fifth reference voltage is an input to a gate of the second switching device, wherein the first reference voltage is an input to a first electrode of the second switching device, and wherein a second electrode of the second switching device is electrically connected to a second node;

wherein a gate of the third switching device is electrically connected to the second node, wherein a first electrode of the third switching device is electrically connected to the first node, and wherein the second reference voltage is an input to a second electrode of the third switching device;

wherein a gate of the fourth switching device is electrically connected to the first node, wherein a first electrode of the fourth switching device is electrically connected to the second node, and wherein the second reference voltage is an input to a second electrode of the fourth switching device; and wherein the first voltage signal is an input to the first node and the third voltage signal is an output from the first node, and wherein the first voltage signal controls a voltage level of the first node to jump;

wherein the second voltage signal is an output from the second node; and wherein a channel of the first switching device is wider than a channel of the second switching device.

9. The shift register according to claim 8, wherein both the first switching device and the second switching device are PMOS transistors; and wherein both the third switching device and the fourth switching device are NMOS transistors; and the first reference voltage is higher than the second reference voltage.

10. A system for operating shift register, the system comprising:
a gate driving circuit, wherein the gate driving circuit comprising N cascaded shift registers, where N is a positive integer greater than 2;
wherein the N cascaded shift registers are configured to be at N stages;
wherein each of the N cascaded shift registers comprises:
an input circuit configured to output a first voltage signal in response to an input signal;
a trigger circuit configured to:
generate a second voltage signal based on a first reference voltage and a second reference voltage, in response to the first voltage signal; and
generate a third voltage signal, different than the second voltage signal, based on the first reference voltage and the second reference voltage, in response to the first voltage signal; and
an output circuit configured to output a scanning signal based on the second voltage signal and the third voltage signal;
wherein the trigger circuit comprises a first switching device, a second switching device, a third switching device and a fourth switching device;
wherein the first reference voltage is an input to a gate and a first electrode of the first switching device, and wherein a second electrode of the first switching device is electrically connected to a first node;
wherein the first reference voltage is an input to a gate and a first electrode of the second switching device, and wherein a second electrode of the second switching device is electrically connected to a second node;
wherein a gate of the third switching device is electrically connected to the second node, wherein a first electrode of the third switching device is electrically connected to the first node, and wherein the second reference voltage is an input to a second electrode of the third switching device; and wherein a gate of the fourth switching device is electrically connected to the first node, wherein a first electrode of the fourth switching device is electrically connected to the second node, and wherein the second reference voltage is an input to a second electrode of the fourth switching device; and wherein the first voltage signal is an input to the first node and the third voltage signal is an output from the first node, and wherein the first voltage signal controls a voltage level of the first node to jump;

wherein the second voltage signal is an output from the second node; and wherein a channel of the first switching device is wider than a channel of the second switching device.

11. The system for operating the shift register according to claim 10, wherein the input circuit comprises a fifth switching device and a sixth switching device;
wherein a first input signal is an input to a gate of the fifth switching device, wherein a third reference voltage is an input to a first electrode of the fifth switching device, and wherein a second electrode of the fifth switching device is electrically connected to the first node; and
wherein a second input signal is an input to a gate of the sixth switching device, wherein a first electrode of the sixth switching device is electrically connected to the first node, and wherein a fourth reference voltage is an input to a second electrode of the sixth switching device; and
wherein the second electrode of the fifth switching device and the first electrode of the sixth switching device output the first voltage signal.

12. The system for operating the shift register according to claim 11, wherein the output circuit comprises a pull-up circuit and a pull-down circuit,
wherein the pull-up circuit is configured to control the scanning signal to be at a first voltage level, and wherein the pull-down circuit is configured to control the scanning signal to be at a second voltage level; and wherein the first voltage level is higher than the second voltage level.

13. The system for operating the shift register according to claim 11, wherein the gate driving circuit performs a forward scan;
wherein the third reference voltage is higher than the fourth reference voltage; and
wherein for the n-th stage of shift register, the first input signal is a scanning signal of the (n−1)th stage of shift register, and the second input signal is a scanning signal of the (n+1)th stage of shift register, where n is a positive integer larger than 1 and not larger than N.

14. The system for operating the shift register according to claim 11, wherein the gate driving circuit performs a reverse scan;
wherein the third reference voltage is lower than the fourth reference voltage; and
wherein for the n-th stage shift register, the first input signal is a scanning signal of the (n+1)th stage of shift register, and the second input signal is a scanning signal of the (n−1)th stage of shift register, where n is a positive integer larger than 1 and smaller than N.

15. A system for operating a shift register, the system comprising:

a gate driving circuit, wherein the gate driving circuit comprising N cascaded shift registers, where N is a positive integer greater than 2;

wherein the N cascaded shift registers are configured to be at N stages;

wherein each of the N cascaded shift registers comprises:
an input circuit configured to output a first voltage signal in response to an input signal;
a trigger circuit configured to:
generate a second voltage signal based on a first reference voltage and a second reference voltage, in response to the first voltage signal; and
generate a third voltage signal, different than the second voltage signal, based on the first reference voltage and the second reference voltage, in response to the first voltage signal; and
an output circuit configured to output a scanning signal based on the second voltage signal and the third voltage signal;
wherein the trigger circuit comprises a first switching device, a second switching device, a third switching device and a fourth switching device;
wherein a fifth reference voltage is an input to a gate of the first switching device, wherein the first reference voltage is an input to a first electrode of the first switching device, and wherein a second electrode of the first switching device is electrically connected to a first node;

wherein the fifth reference voltage is an input to a gate of the second switching device, wherein the first reference voltage is an input to a first electrode of the second switching device, and wherein a second electrode of the second switching device is electrically connected to a second node;

wherein a gate of the third switching device is electrically connected to the second node, wherein a first electrode of the third switching device is electrically connected to the first node, and wherein the second reference voltage is an input to a second electrode of the third switching device; and wherein a gate of the fourth switching device is electrically connected to the first node, wherein a first electrode of the fourth switching device is electrically connected to the second node, and wherein the second reference voltage is an input to a second electrode of the fourth switching device; and wherein the first voltage signal is an input to the first node and the third voltage signal is an output from the first node, and wherein the first voltage signal controls a voltage level of the first node to jump;

wherein the second voltage signal is an output from the second node; and wherein a channel of the first switching device is wider than a channel of the second switching device.

* * * * *